(12) United States Patent
England

(10) Patent No.: US 7,622,786 B2
(45) Date of Patent: Nov. 24, 2009

(54) EMI SHIELDING FOR IMAGER DEVICES

(75) Inventor: Luke England, Portland, ME (US)

(73) Assignee: Aptina Imaging Corporation, Grand Cayman (KY)

( * ) Notice: Subject to any disclaimer, the term of this patent is extended or adjusted under 35 U.S.C. 154(b) by 115 days.

(21) Appl. No.: 11/966,642

(22) Filed: Dec. 28, 2007

(65) Prior Publication Data
US 2009/0166781 A1 Jul. 2, 2009

(51) Int. Cl.
*H01L 31/02* (2006.01)
(52) U.S. Cl. .................... 257/434; 257/431; 257/432; 257/98; 257/686; 257/777; 257/E31.117; 257/E31.127
(58) Field of Classification Search ......... 257/431–448, 257/98, 686, 777, E31.117, E31.127
See application file for complete search history.

(56) References Cited
U.S. PATENT DOCUMENTS

2005/0019986 A1* 1/2005 Pike et al. .................. 438/118
2005/0046003 A1* 3/2005 Tsai .......................... 257/686
2005/0161587 A1* 7/2005 Mihara et al. ........... 250/214 R

* cited by examiner

*Primary Examiner*—Cuong Q Nguyen
*Assistant Examiner*—Trang Q Tran
(74) *Attorney, Agent, or Firm*—Kramer Levin Naftalis & Frankel LLP

(57) ABSTRACT

A module that provides EMI shielding for imager devices is disclosed which includes a die comprising an imager device and a plurality of contact pads, a stack positioned above the imager device, the stack comprising at least one lens, a conductive layer positioned above the stack, the conductive layer comprising at least one light opening, and a plurality of wire bonds, each of which conductively couples the conductive layer to one of the contact pads on the die. A method of providing EMI shielding for an imager module is also disclosed which includes conductively coupling a conductive layer of the module to a plurality of contact pads on an imager die and forming an encapsulant material that encapsulates at least the plurality of wire bonds, the conductive layer and the contact pads.

14 Claims, 3 Drawing Sheets

EMI SHIELDING FOR IMAGER DEVICES

BACKGROUND

1. Technical Field

The present subject matter is generally directed to the field of microelectronic imager devices and EMI shielding for imager devices.

2. Description of the Related Art

Microelectronic imagers are used in digital cameras, wireless devices with picture capabilities, and many other applications. Cell phones and Personal Digital Assistants (PDAs), for example, are incorporating microelectronic imagers for capturing and sending pictures. The growth rate of microelectronic imagers has been steadily increasing as they become smaller and produce better images with higher pixel counts.

Microelectronic imagers include image sensors that use Charged Coupled Device (CCD) systems, Complementary Metal-Oxide Semiconductor (CMOS) systems, or other systems. CCD image sensors have been widely used in digital cameras and other applications. CMOS image sensors are also quickly becoming very popular because of their relative lower production costs, higher yields and smaller sizes. CMOS image sensors can provide these advantages because they are manufactured using technology and equipment developed for fabricating semiconductor devices. CMOS image sensors, as well as CCD image sensors, are accordingly "packaged" to protect the delicate components and to provide external electrical contacts.

FIG. 1 is a schematic view of a conventional microelectronic imager 1 with a conventional package. The imager 1 includes a die 10 attached to an interposer 20 and a housing 30 attached to the interposer 20. The housing 30 surrounds the periphery of the die 10 and has an opening 32. The imager 1 also includes a transparent cover 40 over the die 10.

The die 10 includes an array of image sensors 12 and a plurality of bond pads 14 that are electrically coupled to the array of image sensors 12. The interposer 20 is typically a dielectric fixture having a plurality of bond pads 22, a plurality of ball pads 24 and traces 26 electrically coupling bond pads 22 to corresponding ball pads 24. The ball pads 24 are arranged in an array for surface mounting the imager 1 to a printed circuit board or module of another device. The bond pads 14 on the die 10 are electrically coupled to the bond pads 22 on the interposer 20 by wire bonds 28 to provide electrical pathways between the bond pads 14 and the ball pads 24. The interposer 20 can also be a lead frame or ceramic housing.

The imager 1 shown in FIG. 1 also has an optics unit including a support 50 attached to the housing 30 and a barrel 60 adjustably attached to the support 50. The support 50 can include internal threads 52, and the barrel 60 can include external threads 62 engaged with the threads 52. The optics unit also includes one or more lenses 70 carried by the barrel 60.

There is a continued trend in the computer industry toward ever higher speed integrated circuit (IC) assemblies based upon semiconductor device technology. Such high signal speeds, however, lack utility unless accompanied by suppression of system noise to an acceptable level. The trend toward lower operational signal voltages in combination with such high speeds exacerbates noise problems.

At state-of-the art operational speeds, signal propagation delays, switching noise and crosstalk between signal conductors resulting from mutual inductance and self inductance phenomena of the conductive paths all become significant to signal degradation. Mutual inductance results from an interaction between magnetic fields created by signal currents flowing to and from a lead frame-mounted, packaged semiconductor device through the leads or "lead fingers," while self inductance results from the interaction of the foregoing fields with magnetic fields created by oppositely-directed currents flowing to and from ground.

Therefore, the integrated circuits carried on a semiconductor device would ideally be electrically connected to conductive traces on carrier substrates such as printed circuit boards and thus to other semiconductor devices carried on the same or other such substrates by infinitesimally short conductors, eliminating impedance problems such as undesirable inductance and other conductor-induced system noise.

As a practical matter, however, as the capacity and speed of many semiconductor devices, such as dynamic random access memories (DRAMs), has increased, the number of inputs and outputs (I/Os) to each semiconductor device has increased, requiring more numerous and complex external connections thereto, and in some instances requiring undesirably long lead frame lead fingers to place the inner lead ends in contact with, or in close proximity to, the bond pads serving as I/Os for the typical semiconductor device.

Certain currently-popular semiconductor device and package configurations serve to exacerbate the noise problems by favoring a large plurality of laterally adjacent lead fingers of substantial length. For example, so-called lead-over-chip (LOC) configurations typically place the bond pads of a semiconductor device in one or two rows extending along the longitudinal axis of the semiconductor device. To accommodate the centralized bond pad location for wire-bonding and at the same time eliminate the need for a conventional die-attach paddle as a physical semiconductor device support, LOC lead frames have been developed which employ lead fingers extending from the sides of the semiconductor device and over the active surface into close proximity with the bond pad row or rows. The semiconductor device is then supported from the undersides of the extending lead fingers, typically through an intervening polyimide film such as a Kapton™ tape having an adhesive coating on its upper and lower surfaces, the film serving as a dielectric, an alpha barrier and a protective coating for the active surface.

While a mechanically desirable packaging concept, the LOC-type long, mutually parallel lead fingers running over the active surface become abusive in terms of unacceptably increasing real impedance as well as lead inductance (both self and mutual) in the circuit. These lead finger runs also increase signal reflection in the circuit due to transmission line effects and degrade signal integrity due to the aforementioned propagation delays, switching noise and crosstalk. Further, elimination of the die-attach paddle also eliminates the potential for employing a ground plane under the semiconductor device without additional processing steps, and such a ground plane in any case would not alleviate the problems attendant to use of the long lead fingers extending over the semiconductor device's active surface.

LOC configurations are merely one example of the type of packaging promoting the above-referenced undesirable noise phenomena. However, the same undesirable characteristics may be experienced with other lead frame configurations employing extended lead fingers, particularly large groups of such lead fingers in close mutual proximity. Such configurations include lead-under-chip (LUC) configurations, and configurations wherein a large number of leads extend from several sides of a semiconductor device to a single side or edge of a package, such as in a vertical surface mount package, or VSMP.

In a broad sense, electromagnetic interference (EMI) may be very problematic as it relates to the successful operation of semiconductor devices, including imager devices. With respect to imager devices, attempts have been made to provide EMI shielding by placing a conductive "can" over the device and connecting the can to ground. Such cans have also been employed to block undesirable light from entering the imager device. Unfortunately, such devices are relatively expensive and involve the added process of affixing such a can to the imager device. Additionally, an imager device may be subject to EMI generated by other devices placed in close proximity to the imager device. For example, EMI generated by an antenna or RF device on a motherboard of a cell phone may adversely impact an imager device positioned near such devices.

The present subject matter is directed to a device and various methods that may solve, or at least reduce, some or all of the aforementioned problems.

BRIEF DESCRIPTION OF THE DRAWINGS

The subject matter disclosed herein may be understood by reference to the following description taken in conjunction with the accompanying drawings, in which like reference numerals identify like elements, and in which.

Figure 1:
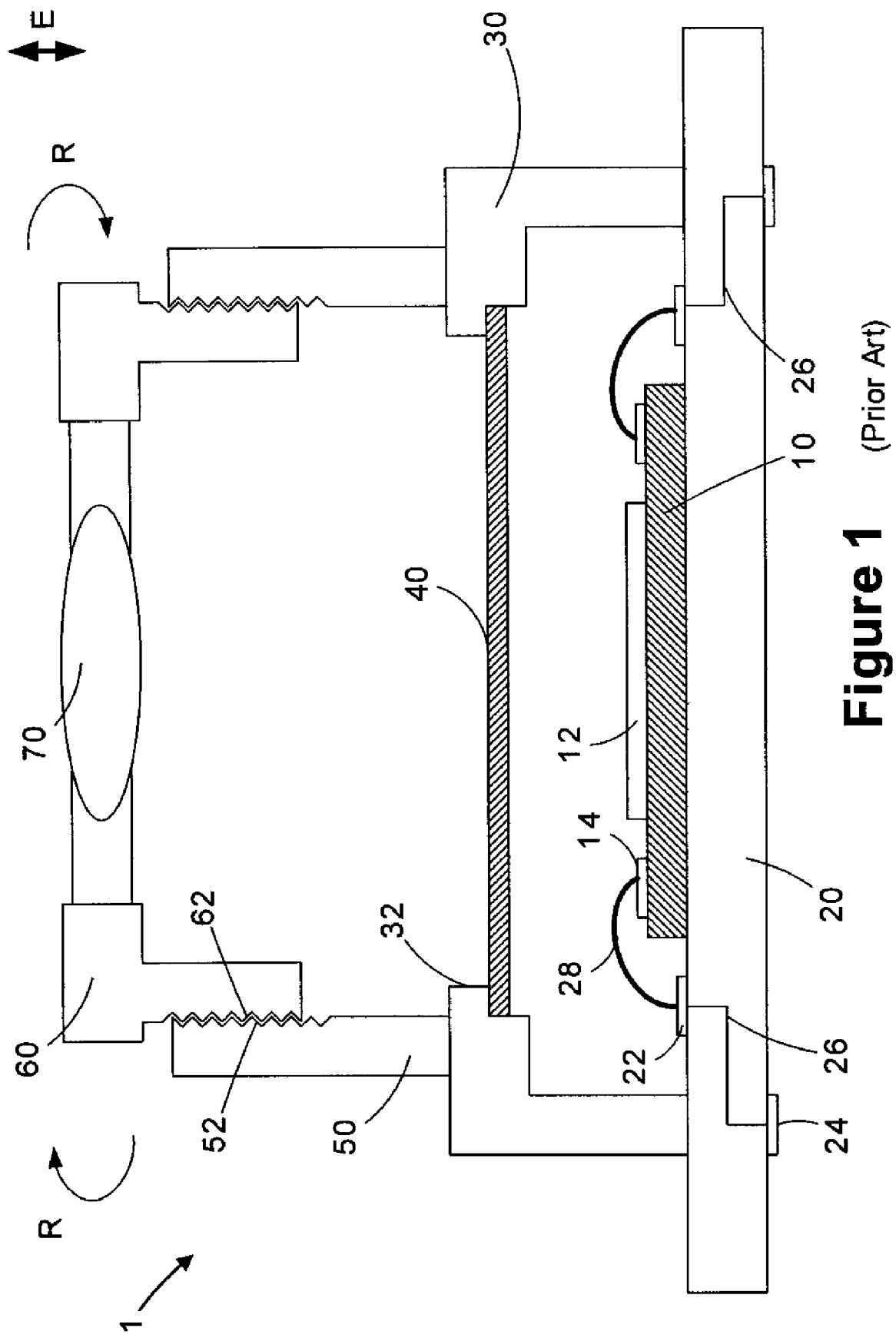
FIG. 1 is a schematic depiction of an illustrative prior art imager device.

While the subject matter described herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Illustrative embodiments of the present subject matter are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

Although various regions and structures shown in the drawings are depicted as having very precise, sharp configurations and profiles, those skilled in the art recognize that, in reality, these regions and structures are not as precise as indicated in the drawings. Additionally, the relative sizes of the various features and doped regions depicted in the drawings may be exaggerated or reduced as compared to the size of those features or regions on fabricated devices. Nevertheless, the attached drawings are included to describe and explain illustrative examples of the subject matter disclosed herein.

Figure 2:
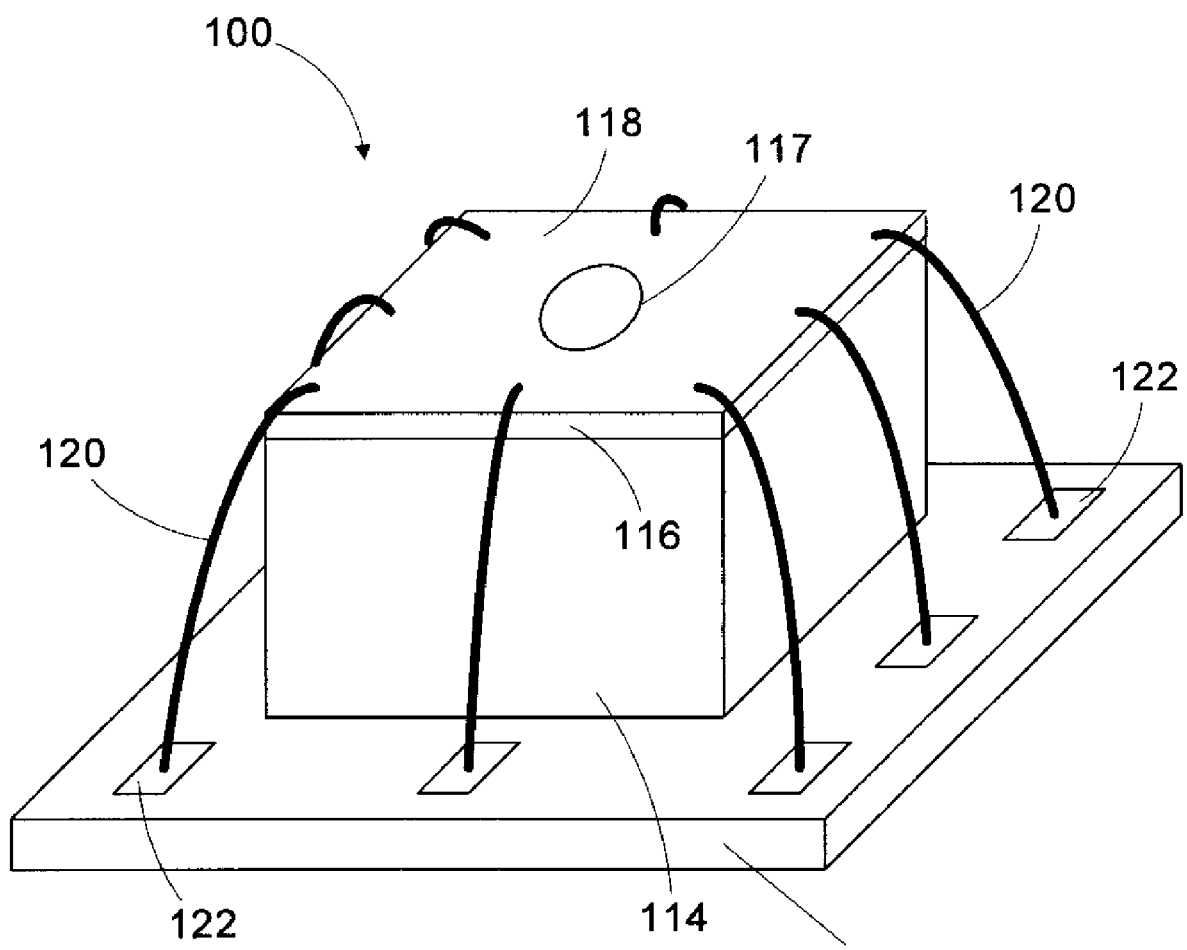
FIGS. 2 and 3 are perspective views of an illustrative imager device that may be utilized as described herein.
Figure 3:
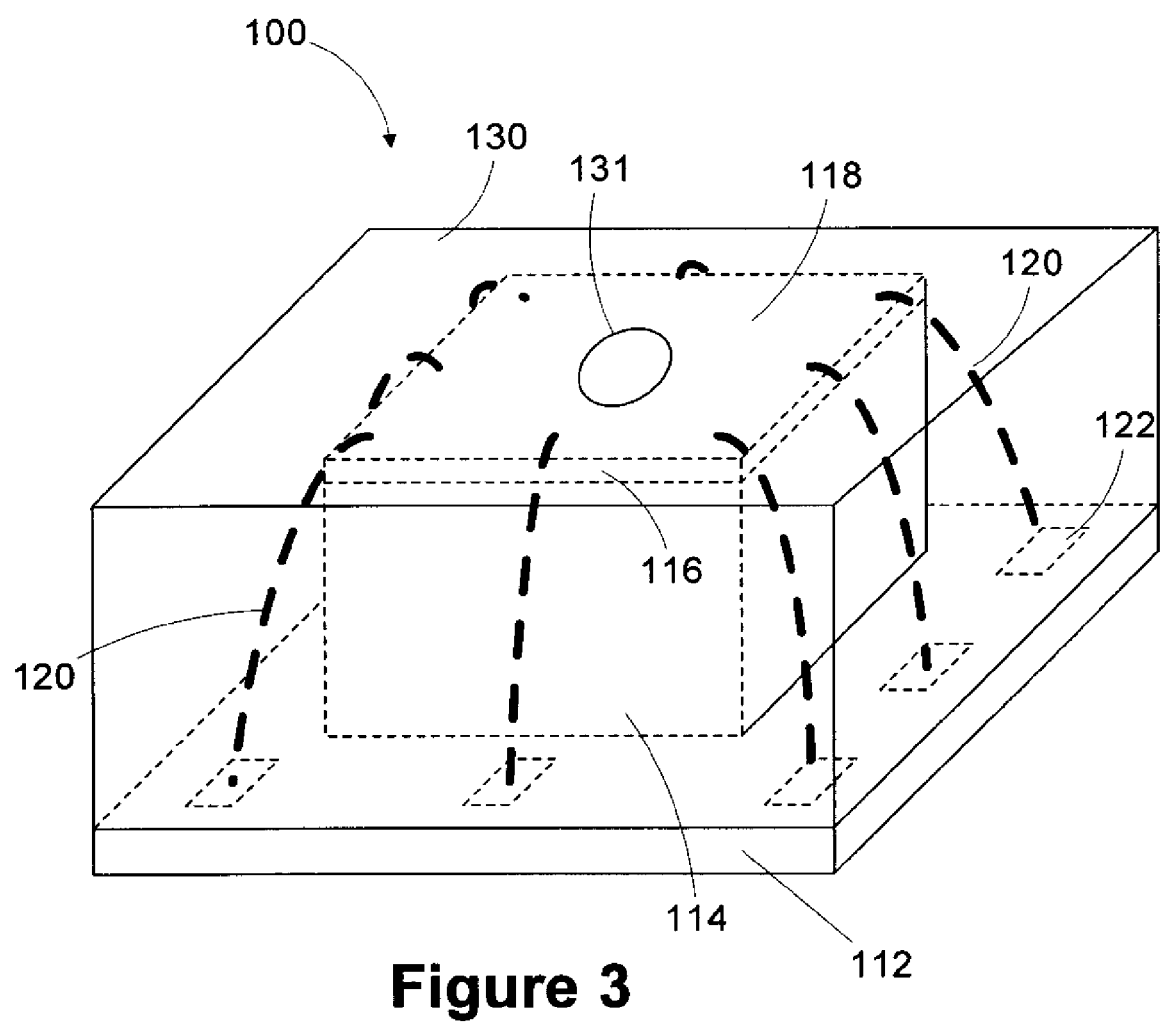

FIGS. 2 and 3 are perspective views of a schematically depicted imager device module 100 with EMI shielding as described herein. The imager device module 100 comprises an imager die 112, a lens stack 114, a conductive layer 116 and a lens aperture 117. A plurality of contact pads 122 are formed on the imager die 112. Each of a plurality of wire bonds 120 are conductively coupled to the conductive layer 118 and a contact pad 122. In one illustrative example, the lens stack 114 may comprise two lens stacked above one another. The vertical spacing between the two lens may be provided by stand-off structures, e.g., glass stand-off structures. Each lens may be formed or positioned in a layer of glass or other like material. However, so as not to obscure the present subject matter, the precise details of the lens stack 114 are not provided. As will be recognized by those skilled in the art after a complete reading of the present application, the lens stack 114 described herein may take on a variety of shapes and perform a variety of functions. Moreover, the lens stack 114 may comprise only a single lens in some applications.

The contact pads 122 are adapted to be conductively coupled to electrical ground. In one illustrative example, the contact pads 122 are conductively coupled to conductive members (not shown) that extend through the imager die 112—so-called through-wafer interconnects. In some cases, only some of the contact pads 22 are through-wafer connected to electrical ground, e.g., the four corner contact pads 22, while the other contact pads 22 are connected to such corner pads via internal circuitry formed within the die 112. By use of such a structure, the contact pads 122 may ultimately be connected to electrical ground in an underlying interposer structure or other structure (not shown), e.g., a printed circuit board. Of course, other techniques may be employed such that the conductive layer 116 is maintained at any desired voltage for purposes of reducing EMI.

The size, shape and placement of the wire bonds 120 is determined so as to provide the desired amount of EMI shielding to the imager device. In the depicted example, eight illustrative wire bonds 120 are provided to provide the desired degree of EMI shielding. In one particular application, the wire bonds 120 are positioned around the entire perimeter of the imager device, e.g., at least one wire bond 120 is provided on each side of the imager device. To the extent additional EMI shielding is desired, the number, size and/or placement of the wire bonds 120 may be varied. The size and materials of construction for the wire bonds 120 may vary depending upon the particular application. In one illustrative embodiment, the wire bonds 120 may be composed of a gold, copper or silver material, and they may have a diameter of 15-50 µm. Of course, the wire bonds 120 may be made from a variety of other conductive materials so long as such materials are suitable for wire bonding attachment. The wire bonds 120 may be attached to the pads 122 and the conductive layer 116 using traditional wire bonding techniques and equipment. In some applications, attachment of the wire bonds 120 to the pads 122 may be accomplished using deep access capillary structures, which are known to those skilled in the art. In one illustrative example, a capillary structure manufactured by Gaiser Tool Company (Part No. 1572-12-437GM-SB20X120) may be employed in making some of the wire bond connections disclosed herein.

Similarly, the conductive layer 116 may be formed from a variety of conductive materials, e.g., chrome, silver, etc., and it may have a thickness that varies depending upon the particular application. In one illustrative embodiment, the conductive layer 116 is comprised of chrome, and it has a thickness of approximately 0.5-10 µm. The conductive layer may be formed used any of a variety of known techniques.

The layer of conductive material 116 has at least one light opening 117 formed therein so as to permit light to enter the module 100 and irradiate the underlying imager device. The size and shape of the light opening 117 may vary depending upon the application. Additionally, the light opening 117 may be completely open, or there may be some other structure within the light opening 117, e.g., a clear lens. Thus, when the phrase "light opening" is used herein, it is to be understood that such an opening may be free of any additional structure or it may have additional structures or devices located at least partially within the light opening 117.

After the wire bonds 120 have been attached, a body of encapsulant material 130 is formed around the module 100. The encapsulant material 130 may be of any desired shape, and it may be formed using a variety of materials, e.g., mold compound, a thermosetting plastic, etc. In the illustrative example depicted herein, the encapsulant material 130 is schematically depicted with a box-like configuration. After a complete reading of the present application, those skilled in the art will readily appreciate that the size, configuration and materials of construction for the encapsulant material may vary depending upon the particular application. Additionally, the encapsulant material 130 may be formed using traditional manufacturing techniques, e.g., transfer molding techniques, compression molding, liquid epoxy dispense, etc. The encapsulant material 130 also has an opening 131 that corresponds to the light opening 117 in the conductive layer 116. It should be understood that, when reference is made herein to the encapsulant material 130 encapsulating the device, it is not required that the entirety of the device be actually covered. Rather, the encapsulant material 130 should be present in areas such that it protects the structures used to provide the desired EMI shielding, e.g., the wire bonds 120, the contact pads 122, the connections between the wire bonds 120 and the contact pads 122, and the conductive layer 116. In the illustrative example depicted in FIG. 3, the encapsulant material 130 encapsulates the entirety of the imager devices.

One illustrative module 100 described herein includes a die 112 comprising an imager device and a plurality of contact pads 122. A stack 114 is positioned above the imager device that comprises at least one lens, a conductive layer 116 positioned above the stack 114 and a plurality of wire bonds 122, each of which conductively couples the conductive layer 116 to one of the contact pads 122 on the die 112. In some cases, the wire bonds 122 may extend around the entire perimeter of the conductive layer 116, e.g., each of the sides of the conductive layer 116 is conductively coupled to at least one of the wire bonds. The module 100 may also include an encapsulant material 130 that is positioned at least around the plurality of wire bonds 122 and the stack 114.

One illustrative method described herein for providing EMI shielding for an imager module involves conductively coupling a conductive layer 116 of the module to a plurality of contact pads 122 on an imager die 112 using a plurality of wire bonds 1220, and forming an encapsulant material 130 that encapsulates at least the plurality of wire bonds 122, at least a portion of the conductive layer 116 and the contact pads 122. Another method disclosed herein involves positioning a stack 114 (having at least one lens) above an imager device positioned on an imager die 112, the imager die 112 comprising a plurality of contact pads 122, and the stack 114 comprising a conductive layer 116, wire bonding a plurality of wire bonds 122 to the conductive layer 116 and the contact pads 122 and forming an encapsulant material 130 that encapsulates at least the plurality of wire bonds 122, at least a portion of the conductive layer 116 and the contact pads 122.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A module, comprising:
    a die comprising an imager device and a plurality of contact pads;
    a stack positioned above the imager device, the stack comprising at least one lens;
    a conductive layer positioned above the stack, the conductive layer comprising at least one light opening; and
    a plurality of wire bonds, each of which conductively couples the conductive layer to at least one of the contact pads on the die.

2. The module of claim 1, wherein the conductive layer is comprised a metal.

3. The module of claim 1, wherein the plurality of wire bonds are comprised of gold, copper or silver.

4. The module of claim 1, wherein each of the plurality of contact pads are conductively coupled to electrical ground.

5. The module of claim 1, wherein the at least one light opening is adapted to permit light to irradiate the imager device.

6. The module of claim 1, further comprising an encapsulant material that is positioned at least around the plurality of wire bonds and the stack.

7. The module of claim 6, wherein the encapsulant material covers the contact pads and at least a portion of the conductive layer.

8. The module of claim 6, wherein the encapsulant material has an opening that corresponds with the light opening in the conductive layer.

9. The module of claim 1, wherein the plurality of wire bonds extend around an entire perimeter of the conductive layer.

10. The module of claim 1, wherein the conductive layer has a plurality of sides, each of the sides being conductively coupled to at least one of the plurality of wire bonds.

11. A module, comprising:
    a die comprising an imager device and a plurality of contact pads;
    a stack positioned above the imager device, the stack comprising at least one lens;
    a conductive layer positioned above the stack, the conductive layer comprising at least one light opening;
    a plurality of wire bonds, each of which conductively couples the conductive layer to one of the contact pads on the die, the plurality of wire bonds extending around an entire perimeter of the conductive layer; and
    an encapsulant material that is positioned at least around the plurality of wire bonds and the stack.

12. The module of claim 11, wherein the encapsulant material covers the contact pads and at least a portion of the conductive layer.

13. The module of claim 11, wherein the encapsulant material has an opening that corresponds with the light opening in the conductive layer.

14. The module of claim 11, wherein the conductive layer has a plurality of sides, each of the sides being conductively coupled to at least one of the plurality of wire bonds.

* * * * *